(12) United States Patent
Aschke et al.

(10) Patent No.: US 7,517,617 B2
(45) Date of Patent: Apr. 14, 2009

(54) MASK BLANK FOR USE IN EUV LITHOGRAPHY AND METHOD FOR ITS PRODUCTION

(75) Inventors: Lutz Aschke, Mainz (DE); Markus Renno, Meiningen (DE); Mario Schiffler, Oepfershausen (DE); Frank Sobel, Meiningen (DE); Hans Becker, Meiningen (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/825,618

(22) Filed: Apr. 16, 2004

(65) Prior Publication Data

US 2004/0234870 A1   Nov. 25, 2004

(30) Foreign Application Priority Data

Apr. 16, 2003   (DE) ................ 103 17 792

(51) Int. Cl.
*G03F 1/00* (2006.01)
(52) U.S. Cl. ............................................. 430/5
(58) Field of Classification Search ........... 430/5; 378/35; 204/192.1, 192.11
See application file for complete search history.

(56) References Cited

U.S. PATENT DOCUMENTS

| | | | |
|---|---|---|---|
| 4,875,989 A | 10/1989 | Davis et al. | |
| 5,362,608 A | 11/1994 | Flaim et al. | |
| 5,952,050 A | 9/1999 | Doan | |
| 6,074,504 A | 6/2000 | Yu et al. | |
| 6,229,871 B1 | 5/2001 | Tichenor | |
| 6,267,853 B1 | 7/2001 | Dordi et al. | |
| 6,352,803 B1 * | 3/2002 | Tong et al. ............. | 430/5 |
| 6,841,309 B1 * | 1/2005 | Alpay et al. ........... | 430/5 |
| 6,984,475 B1 * | 1/2006 | Levinson et al. ...... | 430/5 |
| 2002/0076625 A1 | 6/2002 | Shoki et al. | |
| 2003/0057192 A1 | 3/2003 | Patel | |
| 2004/0041102 A1 | 3/2004 | Kamm | |
| 2004/0067420 A1 | 4/2004 | Ota | |

FOREIGN PATENT DOCUMENTS

| | | |
|---|---|---|
| DE | 19536474 | 4/1997 |
| DE | 19900910 | 7/2000 |
| EP | 0627277 | 12/1994 |
| JP | 2002-299228 | 10/2002 |
| WO | WO 0075727 A2 | 12/2000 |
| WO | WO 0182001 | 11/2001 |

OTHER PUBLICATIONS

Hector S D "EUVL msks: requirements and potential solutions." Proceedings of the SPIE—The International Society for Optical Engineering. 2002. vol. 4688, pp. 134-149.
Mitra I et al: "Improved materials meeting the demands for EUV substrates." Proceedings of the SPIE—The International Society for Optical Engineering. 2003. vol. 5037, pp. 219-226.

* cited by examiner

*Primary Examiner*—S. Rosasco
(74) *Attorney, Agent, or Firm*—Michael J. Striker

(57) ABSTRACT

This invention relates to a mask blank for use in EUV lithography and a method for its production.

The mask blank comprises a substrate with a front side and a rear side whereby a coating is applied to the front side for use as a mask in EUV lithography and the rear side of the substrate comprises an electrically conductive coating. The electrically conductive coating is particularly abrasion resistant and strongly adhesive according to DIN 58196-5 (German Industry Standard), DIN 58196-4 and DIN 58196-6 and characterised by a minimum electrical conductivity. The electrically conductive coating is applied by means of ion-beam-assisted sputtering.

Since the electrically conductive coating on the rear side is so abrasion resistant and strongly adhesive, the mask blank may be gripped, held and handled by means of an electrostatic holding device (chuck) without any troublesome abrasion occurring.

33 Claims, No Drawings

MASK BLANK FOR USE IN EUV LITHOGRAPHY AND METHOD FOR ITS PRODUCTION

The present application claims convention priority of German patent application no. 103 17 792.2-51 the whole content of which is hereby explicitly incorporated by reference.

FIELD OF THE INVENTION

This invention relates to a mask blank for use in EUV lithography (extreme ultraviolet lithography) and a method for its production.

RELATED ART

To achieve ever higher integration densities in microelectronics, it is necessary to use increasingly shorter wavelengths for exposure. It is foreseeable that in future wavelengths of only 13 nanometers or even less will be used in order to produce structures of less than 35 nanometers. In this context, the production of masks for lithographic exposure is of key importance. Masks must be virtually defect-free because otherwise the slightest errors in the mask will be replicated on every chip. All sources that could result in contamination of a mask must be excluded to the greatest degree possible.

This requires extremely precise techniques for the production of mask blanks and extremely careful holding and handling of mask blanks in order to avoid abrasion and particle formation to the greatest degree possible. In view of the risk of contamination of mask blanks, even the slightest improvements to methods of this kind can result in significant improvements to quality in semiconductor production. Therefore, it is not surprising that the methods considered for the production and handling of mask blanks can be relatively complicated and expensive, because the objective of semiconductor production is always to achieve the highest possible integration density with the lowest possible reject rate.

SUMMARY OF THE INVENTION

It is an object of the present invention to provide a mask blank for use in EUV lithography with which the risk of contamination and mask errors can be reduced even further. It is a further object of the intention of the present invention to provide a method for the production of a mask blank of this kind.

According to the present invention, a mask blank for use in EUV lithography is provided whereby the mask blank comprises a substrate with a front side and a rear side and a coating is applied to the front side for use as a mask in EUV lithography. According to the present invention, the rear side of the substrate comprises an electrically conductive coating. This enables a mask blank to be provided with a surprisingly simple design exhibiting advantages with regard to the risk of contamination and particle formation. According to the present invention, the substrate preferably comprises a material with an extremely low coefficient of thermal expansion.

A mask blank according to the present invention may be held at the back and over large areas by means of an electrostatic holding device (electrostatic chuck). Because the electrostatic holding device is in contact with a large area of the rear side of the substrate, only low holding forces are necessary. These result in turn in less abrasion and hence in a lower risk of contamination. In addition, a mask blank according to the invention may be held and handled very gently. An electric potential applied to the electrostatic holding device and/or to the rear side of the mask blank can be advantageously controlled and gently switched on and off. This enables sudden applications of force to the mask blank to be avoided to a large extent, which results in even less abrasion and even lower particle formation. The large area of contact between the mask blank and the electrostatic holding device may also be used to pull the mask blank straight, for example, if it is bent or under tension, in order thus to reduce stress.

Preferably, the resistance of the electrically conductive coating to abrasion from a cloth according to DIN 58196-5 (German Industry Standard) falls into at least category 2. Even if the mask blank or a mask produced therefrom is to be held by hand or by means of handling tools during semiconductor production, for example, during replacement or maintenance work, or if the blank or mask is to be used for further process stages, there is virtually no abrasion because the coating on the rear side is so abrasion-resistant.

Preferably, the resistance of the electrically conductive coating to abrasion from an eraser according to DIN 58196-4 (German Industry Standard) falls into at least category 2. Even if the mask blank or a mask produced therefrom is to be brushed against or held during semiconductor production, for example by hand or using a tool, or if the blank or mask is to be used for further process stages, according to the invention there is virtually no abrasion because the coating on the rear side is so abrasion-resistant.

Preferably, the adhesive strength of the electrically conductive coating in an adhesive tape test according to DIN 58196-6 (German Industry Standard) corresponds to a detachment or delamination of substantially 0%. If an adhesive object should ever come into contact with a mask blank or a mask produced therefrom, for example during replacement or maintenance work, virtually no part of the electrically conductive coating on the rear side will become detached or delaminated; otherwise this would result in contamination and troublesome abrasion. Overall, therefore, it is established that, advantageously, the mask blank according to the invention or a mask produced therefrom may be handled reliably and without maintenance problems.

Preferably, the substrate comprises a material with an extremely low coefficient of thermal expansion, which, for example, may be modified silica glass or modified ceramic glass. For the purposes of this patent application, the term 'material with an extremely low coefficient of thermal expansion' should be interpreted to mean that, in the specified temperature range, a material which does not undergo any significant expansion or at least does not undergo extensive thermal expansion. Preferably, in the temperature range from approximately 0 to 50 degrees Celsius, the material with an extremely low coefficient of thermal expansion has a thermal expansion of less than approximately ±100 ppb/K, more preferably of less than approximately ±30 ppb/K and even more preferably less than approximately ±5 ppb/K, because, in the said ranges, mask blanks may be produced with particularly advantageous properties, in particular with respect to use in a lithographic exposure method and the abrasion resistance of the layers.

Regarding the properties of the zero-expansion materials preferred for use according to the present invention, reference is made by way of example to the following applications, the contents of which are expressly incorporated in this application by reference: DE-OS-19 02 432, U.S. Pat. No. 4,851,372, U.S. Pat. No. 5,591,682 and DE 101 63 597.4.

Corning® 7971 which is an ULE (ultra low expansion) material comprising titanium silicate glass (92.5% $SiO_2$ and 7.5% $TiO_2$) can also be used as the material with an extremely low coefficient of thermal expansion. It is produced by mixing pure liquid silicon tetrachloride and titanium tetrachloride together and delivering the vapours to a furnace, where they react chemically. The glass droplets are deposited on a spinning turntable. It takes one week to produce a blank approximately 170 cm in diameter and 15 cm thick. The glass composition obtained in this way is characterised by an ultra-low coefficient of thermal expansion.

In order to achieve adequate optical properties, a coating is applied at least to the front side of the mask blank, the said coating comprising a system of dielectric double layers, in particular of molybdenum silicon double layers, and one chromium layer or one other layer which absorbs EUV light. In this way, a mask blank with surprisingly high abrasion resistance may be produced which is suitable for use in EUV lithography, in particular with wavelengths down to approximately 13 nanometers.

Preferably, the dielectric double layers are applied by ion-beam-assisted deposition, in particular by ion-beam-assisted sputtering, which results in extremely homogeneous and defect-free layers and hence ensures that the coating has a high degree of reflectivity. Overall, this enables extremely precise imaging optics and masks to be provided. With regard to the coating method, reference is made to the applicant's co-pending U.S. patent application Ser. No. 10/367,539 with the title 'Photo Mask Blank, Photo Mask, Method and Apparatus for Mask Blank, Photo Mask, Method and Apparatus for Manufacturing of a Photo Mask Blank' with a filing date of 13 Feb. 2003, the contents of which are expressly incorporated in this application by reference.

Ion beam sputtering or ion beam deposition (IBD) enables to achieve high quality photo mask blanks of all types.

A photo mask blank, in particular a binary photo mask blank, a phase shifting photo mask blank or an extreme ultra violet photo mask blank is manufactured by providing a substrate and a target in a vacuum chamber, providing a first particle beam in the vacuum chamber and emitted from a first particle source or deposition source, sputtering said target by irradiating with said first particle beam and depositing at least a first layer of a first material on said substrate by said sputtering of said target.

With ion beam sputtering the first ion beam is directed onto the target. Thereby material or particles, e.g. atoms or molecules being sputtered from the target emerge from said target in direction to said substrate and are growing a layer or film on the substrate or on another layer or film already existing on the substrate.

Preferably, the photo mask blank is directly irradiated by a second particle beam emitted by a second particle source or assist source, which is different from the deposition source. In, particular, the second particle beam is directed onto said photo mask blank, i.e. directly onto the substrate or directly onto one of said films deposited on the substrate. The second ion beam is preferably an ion beam too. However, for some applications it could also be an electron beam.

Preferably, irradiating said photo mask blank comprises irradiating said substrate and/or said first film and/or further deposited films before and/or after said step of depositing said film or films. Advantageously irradiating said photo mask blank by said second particle beam provides a large variety of treatment possibilities to improve the quality and performance of the photo mask blank.

Preferably, the target and/or the substrate are mounted rotably or pivotably. By this, the system is adjustable to hit the target under an angle >0 degree, particularly >10 degree with respect to a target normal line by the first particle beam. Further preferably, the substrate defines a substrate normal line and sputtered particles from the sputter target and/or said second particle beam hit said photo mask blank, i.e. the substrate or a further film under an angle >0 degree, particularly >10 degree to the substrate normal line.

Advantageously, the photo mask blank provided has a very low value of film stress of about 0.2 MPa or even less.

A further advantage is that photo mask blanks are provided with an excellent adhesion of the first film on the substrate and/or of films on each other. Furthermore, the method is advantageously highly reproducible, such that a high stability of the optical specifications both inter and intra plate are achieved.

Preferably a gas is used to produce the ions of the first ion beam. The ions of the first ion beam preferably are or comprise rare gas ions, e.g. argon or xenon, because of their different momentum transfer function.

According to a preferred embodiment, a three grid ion extraction grid together with controllable radio frequency power plasma heating provides a separate adjustment of energy and current of the extracted ions within the construction limits. An extraction optical system provides accelerating, directing and/or focusing of the first particle or ion beam on its way to said target.

Preferably the distribution of the sputtered target atoms is adjustable by regulating parameters of the first particle beam, e.g. the incident angle, energy, current and/or mass of the particles or ions. By adjusting or controlling said parameters of the first particle beam, purity, chemical composition, surface condition and/or micro grain size of the target material are adjustable or controllable.

Furthermore the geometrical orientation of the substrate relative to the target, in particular the angle of incidence of the sputtered target atoms is adjustable. Adjusting these parameters the fundamental film growth can be influenced to optimize for stress, homogeneity and optical parameters.

Preferably the assist source and the deposition source are different sources, but are equivalently and/or independently adjustable. By this, the first and second particle beams are separately controllable and/or comprise different particles and/or have different particle energies.

Preferably, a deposition rate of >0.01 nm/sec or >0.05 nm/sec and/or <5 nm/sec, <2 nm/sec, <0.5 nm/sec or <0.3 nm/sec, most preferably in the range of about 0.1 nm/sec ±50% is provided. At first sight this might appear uneconomic, but on the other hand the low deposition rate allows a very precise control of film thickness both by time and in situ control. In particular for phase shifting and EUV photo mask blanks this is advantageous, as a very precise control of film- or period thickness is provided such that the required phase angle and a high reflectivity are achieved. Furthermore a homogeneity of the peak reflection of smaller than ±1% and a homogeneity of the center wavelength of smaller than ±0.1 nm over the whole area of the photo mask blank is achieved.

According to a preferred embodiment, the substrate is conditioned by irradiating the second particle beam before the first film is deposited. In this case a low energy ion beam, e.g. <100 eV or <30 eV is utilized as second particle beam. The energy of the second ion beam is adjusted to a value at which the substrate surface is not damaged by sputtering, but organic impurities, present at the surface, are cracked. Particularly, the energy of the ions of the second particle beam, is higher than the chemical binding energies of the impurities. Preferably, this physical cleaning effect is chemically intensified by providing one or more reactive gases present in the vacuum chamber, for example oxygen, at least for some time during the treatment. Advantageously, the adhesion of the first film on the substrate and/or the films on each other and the defect density are improved.

Alternatively or additionally to said conditioning of the surface, one or more of the films are doped by the second particle beam. Preferably a doping material which is available in gaseous form is used. According to the requirements that gas is used in its original state, ionized by the plasma inside the source or even accelerated towards the photo mask blank. Particularly in this case, the geometry and/or the incidence angle of the second particle beam are adjustable and/or controllable.

Preferably, one or more of the films are doped independently, even when they are sputtered from the same target. So for example two films of the same target material are deposited and either only one film is doped or both films are independently doped, e.g. with different doping materials or doping parameters.

In a preferred embodiment, the last or top layer of a chrome binary mask is optimized for reflection by doping while one or more other films are differently doped, e.g. to adjust and optimize the optical density, the etch time, the adhesion, the reflectance and/or other features. E.g. the reflection of an anti-reflective coating can be decreased.

On the other hand, the reflectance of one or more reflecting layers of a EUV photo mask blank can be increased and/or homogenized by the treatment with the second particle beam.

In a further preferred embodiment, the substrate and/or one, several or all of the films are flattened or smoothened by irradiating with said second particle beam. Preferably a step of irradiating the photo mask blank by said second particle beam is carried out after one or more films are deposited. Flattening or smoothening one or more of the films is particularly advantageous for EUV photo mask blanks as EUV reflectance significantly depend on the interface roughness of the multi-layer stack which is, in particular reduced.

EUV Photo Mask Blank (Example A)

On the substrate is a high reflective multi-layer stack comprising bi-layers or alternating films of Molybdenum and Silicon. For clearness, only the first bi-layer directly contacting the substrate is denoted. Each layer pair or film pair has a thickness of 6.8 nm and the fraction of Molybdenum is 40%, resulting in a total thickness of 272 nm of the Mo/Si multi-layer stack. The multi-layer stack represents an EUV mirror and is protected by a 11 nm Silicon capping layer or film which is deposited on top of the multi-layer stack.

On top of the Silicon capping layer an $SiO_2$ buffer layer with a thickness of 60 nm is deposited. Further on top of the buffer layer an absorber layer stack comprising an anti-reflective chrome bi-layer system with a thickness of 70 nm is provided. The absorber layer stack is consisting of two chrome layers.

For manufacturing a structured photo mask from the EUV photo mask blank, the absorber layer stack is structured and partially removed by photo lithography. The buffer layer allows a repair of the structured buffer layer without damage of the multi-layer stack mirror underneath.

Deposition Parameters for Example A

The very low deposition rate of the method according to the invention allows very precise control of the layer thickness. This is highly advantageous, as particularly, the layers of the multi-layer stack mirror are only a few nm thick. The layers can be deposited with a very controlled and reproducible and, therefore equal thickness of each bi-layer. It was found, that with reduced deposition parameters as described in the following, the precision is further increased.

Argon is used as the sputter gas with 10 sccm and the energy of the primary Argon ions in the first ion beam is 600 eV. The current of the first ion beam is set to about 150 mA. To obtain a pure first ion beam, in the deposition source the background pressure is 2e-8 Torr and the partial pressure of Argon is set to 1e-4 Torr.

Molybdenum, silicon and chrome targets are used for the deposition of the molybdenum films Silicon and $SiO_2$ films and chrome films respectively.

The $SiO_2$ buffer layer is doped by the second ion beam comprising oxygen ions with the assist ion source using an oxygen flow of 15 sccm during and/or after the deposition of the buffer layer.

The top layer of the absorber layer pair is doped by the second ion beam using an oxygen flow of 8 sccm to reduce the reflection of the top chrome layer.

Measurement Results of Example A Homogeneity

The results of normal incidence reflectivity measurements using syncrotron radiation at Physikalisch Technische Bundesanstalt (PTB) in Berlin, Germany, can be shown in a figure. Two scans are made. One along the x-axis and one along the y-axis of the photo mask blank being a square 6-inch plate. Each scan consists of 10 measurement points.

The homogeneity of the reflection in a plot of the measured reflection as a function of the location on the 6-inch plate along the x-axis and y-axis can be shown.

The homogeneity of peak reflection in a plot of the measured center wavelength as a function of the location on the 6-inch plate along the x-axis and along the y-axis can be shown.

The homogeneity of the peak reflection is better than ±0.2% and the homogeneity of the center wavelength is better than ±0.02 nm over the whole area of the photo mask blank.

The results of the reflection measurements of all 20 measurement points of the two scans along the x-axis and y-axis can be shown together in one plot. The reflection as a function of the wavelength in nm is plotted and it can be seen that the homogeneity is that excellent, that the 20 curves are nearly not distinguishable in that plot.

A transmission electron microscopy image of a cross section of a portion of the photo mask blank can be made. The substrate and the multi-layer stack are shown. All layers have very smooth surfaces and no systematic error is discernible. This demonstrates the excellent homogeneity and reproducibility of the layers or films deposited and treated.

A mask blank can be produced in a surprisingly simple way in that the coatings on the front side and the rear side are substantially identical or identical in sections. This means that identical coating technology and process stages may be used for both the front side and the rear side of the mask blank. This saves time on their production and reduces the risk of contamination because process chambers or similar in which the mask blank is coated do not necessarily have to be opened and the mask blank does not necessarily have to be transferred to another process chamber. Instead, the mask blank may be coated on the front and rear sides or coated in sections in the same coating process.

To enable the mask blank to be gripped and held even more reliably by an electrostatic holding device, the resistivity of the electrically conductive coating with a layer thickness of approximately 100 nm is at least approximately $10^{-3}$ Ωcm, more preferably at least approximately $10^{-4}$ Ωcm, because this enables the mask blank to be held and gripped even better, even more preferably at least approximately $10^{-5}$ Ωcm, because this enables the mask blank to be held and gripped even better, even more preferably at least approximately $10^{-6}$ Ωcm, because this enables the mask blank to be held and gripped even better, even more preferably at least approximately $10^{-7}$ Ωcm, because this enables the mask blank to be held and gripped even better and even more preferably at least approximately $10^{-8}$ Ωcm, because this enables the mask blank to be held and gripped even better. With a layer thickness of approximately 100 nm, a resistivity of at least approximately $10^{-5}$ Ωcm has been found to be quite particularly preferable.

The present invention also provides a method for the production of a mask blank for use in EUV lithography whereby the mask blank comprises a substrate made of a material with an extremely low coefficient of thermal expansion with a front side and a rear side in which a coating is applied to the front side for use as a mask in EUV lithography and an electrically conductive coating is applied to the rear side.

DETAILED DESCRIPTION OF PREFERRED EMBODIMENTS

The following will describe preferred examples of embodiments according to the present invention by way of examples. When studying the following examples of embodiments, further features, advantages and modifications according to the present invention will be evident to a person skilled in the art.

The mask blank according to the present invention comprises a substrate which comprises a highly homogeneous optical glass, silica glass, ceramic glass or a comparable material. With regard to the thermal expansion, the substrate is preferably virtually a zero-expansion material. The mask blank preferably has a rectangular shape, for example with an edge length of approximately 15 cm. Obviously, the mask blank may also have another geometric shape, for example circular. The substrate is polished with an accuracy of only a few tenths of a nanometer. As is known from the prior art, on the front side a system of dielectric double layers is formed which satisfies the Bragg reflection condition for the amplification of reflected radiation by constructive interference. An example of an exposing wavelength of 13.4 nanometers according to the present invention comprises approximately 50 molybdenum silicon double layers with a molybdenum layer thickness of approximately 2.8 nanometers and a silicon layer thickness of approximately 4 nanometers. Suitable dielectric multilayer systems matching the wavelength used for exposure are known to a person skilled in the art.

Applied to the surface of the dielectric multilayer system is a metal mask, in particular a chromium mask or another EUV absorber to absorb the exposing radiation. The metal layer, in particular the chromium layer, is preferably structured or patterned. The front side of the substrate is preferably overall electrically conducting.

According to the present invention, an electrically conductive coating is applied to the rear side of the substrate. This is preferably applied to the entire surface of the rear side, but can, however, also be applied in a suitable way to sections of the rear side, for example in a ring shape, as a square, for example matched to the outside contour of an electrostatic holding device (electrostatic chuck).

Preferably, the electrically conductive coating is applied to the rear side of the substrate by means of process stages which are identical to those used to produce the corresponding electrically conductive coating on the front side of the substrate. In this way, the mask blank may be produced at least in sections in one single operational step. This can mean that there is no requirement to break up a protective atmosphere or a vacuum in a deposition chamber. Obviously, a dielectric multilayer coating may also be applied to the rear side of the substrate—preferably, this will be identical to the multilayer coating applied to the front side of the substrate.

The substrate and coatings are designed for exposure wavelengths in the ultraviolet part of the spectrum for use in EUV lithography (extreme ultraviolet lithography). One possibility for the future of EUV lithography is the use of wavelengths down to approximately 13 nanometers.

The coatings on the front side of the mask blank are at first structureless or unpatterned. In a subsequent process stage, which may be performed either at the manufacturer's premises or at the premises of the recipient of the mask blank, the coatings are suitably structured or patterned so that a mask for EUV lithography may be provided. The mask blank or mask may be covered with a resist film, for example of a photoresist or a protective lacquer.

Because the rear side of the substrate has an electrically conductive coating, the mask blank may be held and handled using an electrostatic holding device. The electrically conductive coating on the rear side of the mask blank enables electrostatic charges from the mask blank, for example during transportation or handling, to be avoided in an even more effective way.

In principle, all metallisation techniques providing an adequate metallisation quality suitable for the coating of the rear side of the substrate are possible. Ion-beam-assisted deposition, in particular ion-beam-assisted sputtering, has been found to be particularly suitable. With this coating technology, an ion beam is directed onto a target whose material peels off into a vacuum. The target is located in the vicinity of the substrate to be coated and the substrate is coated by the detached target substance by sputtering. Even if this coating method is relatively complex and expensive, it has been found to be particularly suitable for coating masks or mask blanks because the layers applied are particularly homogeneous and defect-free. Ion-beam-assisted deposition may be used to apply a metal or a mixture of two or more metals or dielectrics. As regards the details of the ion-beam-assisted deposition of metals and dielectrics, reference is made to the applicant's co-pending U.S. patent application Ser. No. 10/367, 539 with the title 'Photo Mask Blank, Photo Mask, Method and Apparatus for Mask Blank, Photo Mask, Method and Apparatus for Manufacturing of a Photo Mask Blank' with a filing date of 13 Feb. 2003, the contents of which are expressly incorporated in this application by reference.

The electrically conductive coatings applied in this way to the rear side of the substrate are characterised by several advantageous properties, particularly with regard to abrasion and resistance, which will be described in the following with reference to preferred exemplary embodiments which were produced and characterised in a sequence of relatively complex experiments.

First Exemplary Embodiment

A chromium layer with a thickness of approximately 50 nanometers to approximately 100 nanometers was applied to the rear side of a mask blank by means of ion-beam-assisted sputtering. The resistance of the coating on the rear side to abrasion caused by a cloth was evaluated according to DIN 58196-5 (German Industry Standard). According to DIN 58196-5 (German Industry Standard), the specimen is tested in relation to the specified degree of severity (H25:25 cycles, H50 50 cycles). A stamp with a planar contact surface of 10 mm diameter, over which a cloth comprising 4-ply gauze bandage according to DIN 61631-MB-12 CV/CO is stretched, is drawn to-and-fro for at least 20 mm (one cycle) over the surface of the specimen with a force of 4.5 N.

Following the application of the load, the specimen is cleaned with cotton wool and solvent according to DIN 58752 (German Industry Standard). The surface is subjected to a visual evaluation of reflection and transmission without magnification in a box against a matt-black background at different angles by turning and tilting the specimen in the light of a 100 W filament lamp. The lamp-specimen distance should be approximately 30 to 40 cm; the specimen-eye distance should be approximately 25 cm.

The evaluation according to DIN 58196-6 (German Industry Standard) takes the form of an evaluation of the visibly identifiable layer destruction. The result is assigned to one of the five resistance classes defined in the standard. The resistance classes may be used to evaluate the layer adhesion. According to DIN 58196-5 (German Industry Standard), Category 1 equals no visible layer damage, Category 2 equals a small amount of scattered light as a result of abrasion traces, Category 3 equals more scattered light identifiable with slight indications of incipient partial damage, Category 4 equals clearly identifiable partial damage to the layer and Category 5 equals coating worn down to the substrate.

The aforementioned substrate was evaluated according to DIN 58196-5 (German Industry Standard). The number of strokes was 25 (degree of severity H25). Twenty specimens were evaluated. All specimens were evaluated as belonging to Category 2 or better according to DIN 58196-5.

Second Exemplary Embodiment

A mask blank such as that described in connection with the first exemplary embodiment was tested with reference to DIN 58196-4 (German Industry Standard) to determine the resistance of the coating on the rear side to abrasion caused by an eraser. DIN 58196-4 describes in detail the preparation of the surface of the eraser used (roughening on a ground glass disc, cleaning with isopropanol) and the conduct of the test (diameter of the abrasion surface 6.5-7 mm, abrasion force 4.5 N, abrasion length 20 mm). The eraser is rubbed over the coating on the rear side. Evaluation takes the form of the subjective evaluation of the visibly identifiable layer destruction. The result is assigned to one of the five resistance classes defined in the DIN 58196-5. The resistance classes may be used to evaluate the layer adhesion.

Category 1 equals no identifiable layer damage, Category 2 equals a small amount of scattered light identifiable so that the abrasion trace is identifiable as such, Category 3 equals more scattered light identifiable with slight indications of incipient partial damage, Category 4 equals clearly identifiable partial damage to the layer and Category 5 equals coating worn down to the substrate.

Twenty substrates were evaluated whereby the eraser was rubbed over the rear side coating 20 times. All specimens were evaluated as belonging to Category 2 or better.

Third Exemplary Embodiment

A mask blank such as that described in detail in connection with the first exemplary embodiment was tested using a test method according to DIN 58196-6 (Test of Adhesion Strength using an Adhesive Tape) to determine the adhesion strength of the coating on the rear side. According to DIN 58196-6 (German Industry Standard), the specimen is placed flat on a fixed base (table). Then, a long fresh strip at least 25 mm long from a roll of adhesive tape is stuck onto the surface to be tested by pressing with the finger to ensure there are no bubbles and allowed to protrude over the edge. The adhesive tape should be made of polyester and be at least 12 mm wide.

Its adhesiveness should be (9.8±0.5) N relative to a tape width of 25 mm. After 1 minute, the protruding edge of the tape is taken in one hand and pulled off vertically to the test surface while the other hand holds the specimen securely on the base. Depending upon the degree of severity, the adhesive tape is pulled off slowly—within 2 to 3 seconds (degree of severity K1) or suddenly—within less than 1 second (degree of severity K2). The evaluation takes the form of a subjective evaluation of the visibly identifiable layer destruction which is expressed as a percentage of the detachment caused by the adhesion of the tape to the surface.

Twenty substrates were evaluated. The adhesive tape was pulled off suddenly within less than a second (degree of severity K2). All specimens revealed approximately 0% detachment.

Fourth Exemplary Embodiment

A mask blank such as that described in detail in connection with the first exemplary embodiment was measured using two methods for measuring surface resistance. The following surface resistance values occurred in the centre of the disc. In each case, two measurements were performed for each current.

| Current | Linear van der Pauw method | | Linear four-point method | |
|---------|---------|---------|---------|---------|
| [mA] | Rf [Ohm] | + − | Rf [Ohm] | + − |
| 1 | 26.2056 | 0.0108 | 26.1019 | 0.0028 |
| 2 | 26.2186 | 0.0051 | 26.0941 | 0.0002 |
| 3 | 26.2218 | 0.0061 | 26.0705 | 0.0003 |
| 4 | 26.2140 | 0.0030 | 26.0765 | 0.0001 |
| 5 | 26.2142 | 0.0023 | 26.0788 | 0.0005 |
| Average | 26.2148 | 0.0060 | 26.0844 | 0.0130 |

With an even smaller current of 0.5 mA, starting from the centre point, the following values for surface resistance in Ohm were measured 1 cm from the centre point:

| | | |
|---|---|---|
| 26.2866 | | 26.2703 |
| | 26.2728 | |
| 26.3068 | | 26.2520 |

To calculate the resistivity of the layer, the surface resistance should be multiplied by the layer thickness, so that for example a layer thickness of 40 nm produces 26.2728 Ohm×40 nm=105 μOhmcm.

The electrical conductivity of the coating on the rear side may be calculated in a similar way.

In the aforementioned examples of embodiments, the sputtered-on chromium layers or EUV-absorbing layers could obviously have different thicknesses, for example in the range from approximately 30 nm to approximately 100 nm, more preferably in the range from approximately 40 nm to approximately 90 nm and even more preferably in the range from approximately 50 nm to approximately 70 nm.

Express reference is made to the fact that the specifications in DIN 51896 (German Industry Standard) are expressly incorporated in this patent application by reference in particular as regards the test procedures and evaluations described therein.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever.

In the foregoing and in the examples, all temperatures are set forth uncorrected in degrees Celsius and, all parts and percentages are by weight, unless otherwise indicated.

The entire disclosures of all applications, patents and publications, cited herein and of corresponding German application No. 103 17 792.2, filed Apr. 16, 2003 is incorporated by reference herein.

The preceding examples can be repeated with similar success by substituting the generically or specifically described reactants and/or operating conditions of this invention for those used in the preceding examples. From the foregoing description, one skilled in the art can easily ascertain the essential characteristics of this invention and, without departing from the spirit and scope thereof, can make various changes and modifications of the invention to adapt it to various usages and conditions.

What is claimed is:

1. A mask blank for use in EUV lithography comprising a substrate with a front side and a rear side
wherein the front side comprises a coating suitable for use as a mask in EUV lithography, and
the rear side comprises an electrically conductive coating, wherein, with a layer thickness of about 100 nm, the resistivity of the electrically conductive coating is at least about $10^{-7}$ $\Omega$ cm,
wherein the electrically conductive coating has been applied by ion beam assisted deposition.

2. A method for coating a mask blank for use in EUV lithography comprising
providing a substrate with a front side and a rear side;
applying a coating suitable for use as a mask in EUV lithography to the front side;
applying an electrically conductive coating by ion beam assisted deposition to the rear side, wherein, with a layer thickness of about 100 nm, the resistivity of the electrically conductive coating is at least about $10^{-7}$ $\Omega$ cm.

3. The method according to claim 2, wherein the substrate comprises a material with an extremely low coefficient of thermal expansion.

4. The method according to claim 2, wherein the electrically conductive coating is applied by ion beam assisted sputtering.

5. The method according to claim 4, wherein the conductive coating is applied in such a way that the resistance of the electrically conductive coating to abrasion with a cloth according to DIN 58196-5 (German Industry Standard) falls into at least category two.

6. The method according to claim 4, wherein the conductive coating is applied in such a way that the resistance of the electrically conductive coating to abrasion with an eraser according to DIN 58196-4 (German Industry Standard) falls into at least category two.

7. The method according to claim 4, wherein the conductive coating is applied in such a way that the adhesive strength of the electrically conductive coating determined in an adhesive tape test according to DIN 58196-6 (German Industry Standard) corresponds to a detachment of substantially 0%.

8. The method according to claim 4, in which the front side and the rear side have an identical coating.

9. The method according to claim 4, wherein the electrically conductive coating is applied by
sputtering a target by irradiating with a first particle beam to thereby sputter the electrically conductive coating onto the rear side of the substrate; and
flattening the electrically conductive coating by irradiating with a second particle beam after the deposition of the electrically conductive coating.

10. The method according to claim 9, further comprising cleaning the rear side of the substrate from impurities by irradiating with the second particle beam before the electrically conductive coating is sputtered onto the rear side of the substrate.

11. The method according to claim 10, further comprising
disposing the substrate and the target in a vacuum chamber, and providing at least one reactive gas in the vacuum chamber at a predetermined pressure;
wherein cleaning of the rear side of the substrate has been enhanced by the at least one reactive gas.

12. The method according to claim 11, wherein the at least one reactive gas comprises oxygen.

13. The method according to claim 2, in which at least on the front side of the substrate a coating is applied which comprises a system of di-electric double layers.

14. The method according to claim 13, wherein the dielectric double layers are applied by ion-beam-assisted sputtering.

15. A mask blank for use in EUV lithography comprising a substrate with a front side and a rear side
wherein the front side comprises a coating suitable for use as a mask in EUV lithography, and
the rear side comprises an electrically conductive coating, wherein, with a layer thickness of about 100 nm, the resistivity of the electrically conductive coating is at least about $10^{-7}$ $\Omega$ cm, and a homogeneity of peak reflection of smaller than ±1% and a homogeneity of a center wavelength of smaller than ±0.1 nm over the whole area of the mask blank,
wherein the electrically conductive coating has been applied by ion beam assisted deposition.

16. A mask blank according to claim 15, wherein the electrically conductive coating has a homogeneity of peak reflection of smaller than ±0.2% and a homogeneity of a center wavelength of smaller than ±0.02 nm over the whole area of the mask blank.

17. A mask blank according to claim 15, wherein the electrically conductive coating has a resistivity of at between about $10^{-5}$ $\Omega$ cm and $10^{-7}$ $\Omega$ cm.

18. The mask blank according to claim 15, wherein the substrate comprises a material with an extremely low coefficient of thermal expansion.

19. The mask blank according to claim 15, wherein the electrically conductive coating has been applied by ion beam assisted sputtering.

20. The mask blank according to claim 19, wherein the resistance of the electrically conductive coating to abrasion with a cloth according to DIN 58196-5 (German Industry Standard) falls into at least category two.

21. The mask blank according to claim 19, wherein the resistance of the electrically conductive coating to abrasion with an eraser according to DIN 58196-4 (German Industry Standard) falls into at least category two.

22. The mask blank according to claim 19, wherein the adhesive strength of the electrically conductive coating determined in an adhesive tape test according to DIN 58196-6 (German Industry Standard) corresponds to a detachment of substantially 0%.

23. The mask blank according to claim 19, wherein the front side and the rear side have an identical coating.

24. The mask blank according to claim 19, wherein the electrically conductive coating has been applied by sputtering a target by irradiating with a first particle beam to thereby sputter the electrically conductive coating onto the rear side of the substrate, and flattening the electrically conductive coating by irradiating with a second particle beam after the deposition of the electrically conductive coating.

25. The mask blank according to claim 24, wherein the rear side of the substrate has been cleaned from impurities by irradiating with the second particle beam before the electrically conductive coating is sputtered onto the rear side of the substrate.

26. The mask blank according to claim 25, wherein the substrate and the target have been disposed in a vacuum chamber, at least one reactive gas has been provided in the vacuum chamber at a predetermined pressure, wherein cleaning of the rear side of the substrate has been enhanced by the at least one reactive gas.

27. The mask blank according to claim 26, wherein the at least one reactive gas comprises oxygen.

28. The mask blank according to claim 15, wherein the electrically conductive coating has a resistivity of at least about $10^{-6}$ Ω cm.

29. The mask blank according to claim 15, wherein the electrically conductive coating has a resistivity of at least about $10^{-5}$ Ω cm.

30. The mask blank according to claim 15, wherein the substrate comprises silica glass or ceramic glass.

31. The mask blank according to claim 15, wherein at least on the front side of the substrate a coating is applied which comprises a system of dielectric double layers.

32. The mask blank according to claim 31, wherein the dielectric double layers are applied by ion-beam-assisted deposition.

33. The mask blank according to claim 31, wherein the system of di-electric double layers comprises Mo/Si double layers, and one chromium layer or one EUV-absorbing layer.

* * * * *